United States Patent [19]
Verzaro et al.

[11] Patent Number: 5,569,497
[45] Date of Patent: Oct. 29, 1996

[54] PROTECTIVE COATING OF PLASTIC SUBSTRATES VIA PLASMA-POLYMERIZATION

[75] Inventors: Francis Verzaro, Serres-Castet; Didier Ferry, Artix, both of France

[73] Assignee: Atohaas C.V., Haarlem, Netherlands

[21] Appl. No.: 332,113

[22] Filed: Oct. 31, 1994

[30] Foreign Application Priority Data

Oct. 29, 1993 [FR] France ................................ 93 12946

[51] Int. Cl.$^6$ ........................................ C08J 7/18
[52] U.S. Cl. ............... 427/489; 427/255.3; 427/255.6; 427/296; 427/322; 427/491; 427/492; 427/495; 427/536; 427/539; 427/574; 427/578; 427/585
[58] Field of Search ..................... 427/489, 492, 427/495, 536, 539, 574, 578, 491, 585, 255.3, 255.6, 296, 322

[56] References Cited

U.S. PATENT DOCUMENTS

| | | | |
|---|---|---|---|
| 4,762,730 | 8/1988 | Enke et al. | 427/40 |
| 4,830,873 | 5/1989 | Benz et al. | 427/166 |
| 5,294,464 | 3/1994 | Geisler et al. | 427/489 |

FOREIGN PATENT DOCUMENTS

| | | |
|---|---|---|
| 1 266 591 | 3/1990 | Canada . |
| 0 110 258 | 6/1984 | European Pat. Off. . |
| 0 252 870 | 1/1988 | European Pat. Off. . |
| 0 254 205 | 1/1988 | European Pat. Off. . |
| 42 04 082 A1 | 8/1993 | Germany . |
| WO85/04601 | 10/1985 | WIPO . |

*Primary Examiner*—Bernard Pianalto
*Attorney, Agent, or Firm*—Burns, Doane, Swecker & Mathis, L.L.P.

[57] ABSTRACT

A protective layer or film is deposited onto a face surface of a plastic substrate, e.g., a PMMA shaped article, by (a) placing such plastic substrate on a weakly or unpolarized electrode comprising a plasma-generating circuit, (b) plasma-pretreating the plastic substrate in an oxygen plasma, under primary vacuum, by a pulse of electrical power density of such minimum magnitude as to oxygen-activate a face surface thereof, and (c) plasma-polymerizing at least one organosilicon monomer onto the face surface of said plastic substrate, also under vacuum and from an oxygen/organosilicon monomer plasma, whereby depositing a thin protective layer or film thereon.

21 Claims, 6 Drawing Sheets

PROTECTIVE COATING OF PLASTIC SUBSTRATES VIA PLASMA-POLYMERIZATION

BACKGROUND OF THE INVENTION

1. Field of the Invention

The present invention relates to the deposition, by plasma-polymerization, of a protective layer, film or overcoat onto the face surfaces of substrates shaped from plastic materials.

2. Description of the Prior Art

It is known to this art to coat plastic substrates with a thin barrier layer which is highly impermeable to gases (oxygen, water vapor) via plasma techniques.

Thus, plastic substrates are known that have been coated with a layer of "silica" type, the advantage of which in relation to the existing gas-barrier materials being that the films exhibit high gas-barrier characteristics which are equal to or superior to impermeable barrier materials such as PVDC (polyvinylidene dichloride) or EVOH (polyethylene/vinyl alcohol). These withstand subsequent heat treatments such as sterilization and are transparent to microwave radiation (because of their high electrical resistivity). Such high-barrier films find application in the food packaging industry, where requirements in respect of marked impermeability to gases ($O_2$, water vapor, $CO_2$) are increasingly strict.

Other than their impermeability or gas-barrier properties, these plasma deposits are also useful for the protection of plastics against scratching and abrasion, especially by reason of the fact that they are crosslinked, which imparts considerable hardness thereto.

The deposition of thin layers by plasma polymerization comprehends forming a film at the face surface of a substrate from polymerizable species introduced into a plasma-forming gas (for example saturated or unsaturated hydrocarbons). In a plasma polymerization process the starting material monomers interact with energetic species (electrons, ions, photons) in the gas phase, effecting the breaking of chemical bonds and thus creating free radicals. These free radicals created in the gas phase are adsorbed at the surface of the substrate and bond together and "polymerize."

The coating or film thus formed is deemed a plasma film or a plasma deposit.

Another technique for the deposition of protective layers that provides good results is based on varnishes. However, the advantages of the plasma process, when compared with the varnish technique, are numerous. Thus, the plasma process is a dry route, in contrast to the processes employing varnishes, known as wet-route processes, in which the monomer is used in combination with one or more solvents for reasons of viscosity. These processes require strict conditions for application, especially dust-free rooms at controlled temperature and humidity.

This "clean and non-contaminating deposition" aspect of the plasma process is significant and will become increasingly so in the future, taking account of increasingly stringent government regulations relating to the environment.

In addition, the application of varnishes to articles of complex shape (for example vehicular rear lights) does not lend itself easily to the production of layers of uniform thickness.

In contrast, layer deposition by plasma polymerization permits satisfying this requirement on an article of such type; indeed, the article "bathing" in the gaseous atmosphere of the plasma is accessible to gas molecules in a state of excitation at each of its points, insofar as the fluid mechanics of the system have been properly understood.

However, from the very outset of the development of the plasma deposition technique, problems have evolved relating to the adequacy of the adhesiveness of the thin layer to the plastic substrate onto which it is deposited and many attempts have since been made to obviate these disadvantage and drawbacks.

U.S. Pat. No. 4,830,873 describes a process for the deposition of a scratch-resistant "hard" film, preferably onto polycarbonate, via plasma polymerization, comprising first forming a prelayer from the monomer to be polymerized into a downstream final layer, and then incorporating oxygen progressively (for a few minutes) until the required proportions in the gas mixture have been attained that provide the "hard" film. According to this '873 patent, when oxygen is introduced at the beginning of the process, it is detrimental and adversely affects the subsequent adhesiveness between the hard layer and the substrate.

EP-A-0,254,205 describes a process for the deposition of transparent protective layers based on siliceous compounds, preferably on polyallyl diglycol carbonate. The plasma employed is based on hexamethylidisiloxane (HMDS) and oxygen and is obtained in a radio frequency reactor provided with capacitive coupling. The substrate is arranged on the electrode connected to the frequency generator (or cathode).

Certain specific plasma deposits exhibiting proper adhesiveness are also known to this art, the deposition of which principally being onto polycarbonate.

Such processes, however, do not provide satisfactory results in the case of polymethyl methacrylate and need continues to exist to further improve the adhesiveness of these protective layers to other plastic substrates.

SUMMARY OF THE INVENTION

Accordingly, a major object of the present invention is the provision of an improved process for the deposition, via plasma polymerization, of a layer or of a protective film onto the surface of a plastic substrate, such layer or film exhibiting very good adhesiveness to said substrate.

Briefly, the present invention features a process for depositing a protective film or layer onto a plastic substrate, comprising one stage of pretreatment of the plastic substrate to improve the adhesiveness of the film or layer to the plastic substrate.

To this end, this invention features a process for the deposition, via plasma polymerization, of a protective layer or film onto the face surface of a plastic substrate, and wherein the substrate is subjected to a plasma established in a reactor under primary vacuum by electrical discharge in a gaseous medium.

DETAILED DESCRIPTION OF BEST MODE AND PREFERRED EMBODIMENTS OF THE INVENTION

More particularly according to the present invention, the subject process comprises at least the following stages:

(a) pretreating the substrate by placing same onto a substrate-carrier which is weakly or not polarized, next subjecting it to at least one pretreatment gas under conditions permitting the introduction of oxygen at the surface of the substrate, and then supplying to the gaseous pretreatment medium a minimum quantity of energy to create an amount of oxygen in the plasma sufficient to activate the surface of the substrate, this energy being provided as a pulse of electrical power density, and (b) depositing the protective layer or film onto the surface of the substrate by means of a plasma comprising a gaseous deposition mixture containing at least one gas permitting the introduction of oxygen and at least one organosilicon compound.

By "electrical power density" is intended the electrical energy supplied per unit volume of plasma and per unit time.

The electrical power density pulse corresponds to an energy (product of electrical power density and time) delivered during a short period of time, designated pretreatment time period.

The substrate-carrier is weakly or not polarized (unpolarized). It may be the anode. Indeed, if the pretreatment according to the invention is carried out with the substrate arranged on the cathode (a highly polarized electrode), the results attained are equivalent to those of a deposition without pretreatment and, consequently, manifest a poor adhesiveness of the plasma layer to the plastic substrate.

The substrate, therefore, must not be placed on the cathode. It also must not be exposed to an excessive energy bombardment by the charged species (ions) (several tens to several hundred volts or electron-volts).

On the other hand, at the anode the plastic substrate is at a so-called floating potential which is low in comparison with that or those existing at the cathode (on the order of about ten volts or less).

The electrical power density for the pretreatment is at a value of at least 50 mW/cm$^3$, advantageously ranging from 80 mW/cm$^3$ to 500 mW/cm$^3$ and, more especially, on the order of approximately 165 mW/cm$^3$.

The electrical power density pulse has a duration of from approximately 1 second to approximately 100 seconds, especially from approximately 3 seconds to approximately 50 seconds and, more particularly, on the order of 10 seconds.

The pretreatment gas may be a single gas or a gas admixture.

In the event that a single pretreatment gas is employed in the process according to the invention, it is advantageously selected from among oxygen, nitrous oxide, carbon monoxide and dioxide, water and air. It may also be, in particular, the rare gases, nitrogen or hydrogen, these being capable of exciting the residual oxygen present in the reactor and thus contributing the oxygen required for carrying out the process of the present invention.

In the event that a pretreatment gas mixture is employed in the process of the invention, this comprises at least one of the gases selected from among, in particular, oxygen, nitrous oxide, carbon monoxide and dioxide, water, air, the rare gases, nitrogen and hydrogen, or the like.

The pretreatment gas may additionally comprise at least one organosilicon compound preferably selected from among silanes, alkoxysilanes, siloxanes and silazanes, whether alone or admixed, particularly hexamethyldisiloxane.

The gaseous mixture for depositing the layer or the film comprises, especially as a precursor of layers or films of the SiO$_x$ type, an organosilicon compound preferably selected from among silanes, alkoxysilanes, siloxanes and silazanes, whether alone or admixed. According to the invention, such organosilicon compound is preferably hexamethyldisiloxane (HMDS).

Other than the organosilicon compound, the gaseous deposition mixture also comprises at least one gas preferably selected from among oxygen, nitrous oxide, carbon monoxide or dioxide, water, air, the rare gases, nitrogen and hydrogen, or the like, and especially oxygen.

The pretreatment gas may be identical with or different from the gaseous deposition mixture and the organosilicon compound(s) of the pretreatment gas is (are) identical with or different from that (those) of the gaseous deposition mixture.

The generator frequency is within the range of 0 Hx (in the case of a direct-current generator) to a few GHz, for example 2.45 GHz.

The plastic substrate advantageously comprises a filled or unfilled polymer selected, notably, from among the polyolefins, polyacrylics, polycarbonates, vinylaromatic polymers and, in particular, polypropylene, polystyrene and polymethyl methacrylic (PMMA).

The acrylic polymers may also be copolymers prepared from methyl methacrylate and comonomers such as (meth) acrylic acid, alkyl (meth)acrylates, hydroxyalkyl (meth) acrylates, alkoxyalkyl (meth)acrylates in which the alkyl group has, for example, from 1 to 8 carbon atoms, (meth) acrylonitrile, (meth)acrylamide, maleimide, maleic anhydride, substituted or unsubstituted styrene and dienes such as butadiene.

The substrate which is treated according to the invention may also be shaped from the above (co)polymers which are imidated, for example polymers containing glutarimide functional groups; the imidated copolymers may also contain methyl methacrylate, methacrylic acid, glutaric anhydride and, optionally, methacrylamide groups, it being possible for the amide and imide groups to bear identical or different substituents along the same polymer chain.

The thickness of the layer or of the protective film may vary according to the intended use thereof. Thus, it may have a thickness on the order of 0.1 μm or less when the film is intended as a gas-barrier. It may range, for example, from approximately 2.5 μm to 25 μm, more particularly on the order of 5 μm, in the case of scratch-resistant films.

In order to further illustrate the present invention and the advantages thereof, the following specific examples are given, it being understood that same are intended only as illustrative and in nowise limitative.

In said examples to follow, all of the experiments were conducted under the same experimental conditions, the same operating procedure and the same techniques for analyses and characterization.

I. EXPERIMENTAL CONDITIONS:

(a) The reactor:

The reactor employed was a cylindrical reactor with radio frequency (RF) excitation, 43 cm in diameter and 19 cm in height. A Pyrex sleeve placed at mid-height permitted the inside of the reactor to be viewed over a height of 10 cm. The remainder of the reactor was made of aluminum.

The electrodes, planar and parallel, were discs 20 cm in diameter and spaced 3.5 cm apart. They were made of aluminum. One of them, the cathode, was subjected to the radio frequency excitation at 13.56 MHz by means of an alternating voltage generator. The other, the anode, was grounded. This electrode comprised a system for circulating fluids, enabling its temperature to be controlled; it can thus be cooled by circulating cold water. The power output could attain a value of 300W. The permitted reflected power was 50W; an impedance adaptor allowed it to be reduced to zero such as to obtain a maximum efficiency in respect of the power supplied to the plasma.

Application of vacuum to the reactor was ensured by a pumping unit including a primary pump and a secondary pump fitted upstream of the primary pump, making it possible to provide a limiting vacuum of 0.02 Pa. This pressure was measured with a Penning gauge. With regard to the pressures measured when a test was in progress, an MKS capacitance manometer with a measuring range of between 0.013 Pa and 133 Pa was employed. A liquid nitrogen trap was inserted between the reactor and the primary pump to collect condensible materials and thus to ensure a constant pumping rate. The nominal throughput of the primary pump was 22 m$^3$/h.

(b) Selection of monomer:

The monomer employed for providing a deposit of films of SiO$_x$ types was hexamethyldisiloxane (HMDS).

II. OPERATING PROCEDURE:

(a) Preliminary application of vacuum to the reactor:

Primary vacuum to 0.67 Pa.

(b) Discharge treatment under argon or oxygen plasma:

For a period of time on the order of 10 to 20 minutes:

Conditions of discharge treatment under argon plasma (Examples 2, 3):

pAr=17 Pa discharge treatment time period: 10 minutes

RF power density: 247.5 mW/cm$^3$

Conditions of discharge treatment under oxygen plasma (Examples 4, 5, 6, 7 and 8):

pO$_2$=4.8–11.0 Pa discharge treatment time period: 10–20 minutes

RF power density: 165 Mw/cm$^3$ (c) Return of the reactor to atmospheric pressure and opening.

(d) Positioning of the substrate at the anode.

(e) Preliminary application of vacuum to the reactor:

Primary vacuum to 0.67 Pa

Secondary vacuum to 0.02 Pa (f) Pretreatment:

Before deposition of the layer or film onto the surface of the plastic substrate; the pretreatment gas was introduced into the reactor at a certain flow rate. There was a delay for the pressure inside the reactor to stabilize. The plasma was switched on at a certain value of the RF power density. The pretreatment was carried out for a variable short time period. The generator may optionally be stopped; in this instance, there was no longer any plasma.

It was optional to terminate the gas delivery before introducing the deposition gases and to attain a vacuum on the order of 0.67 Pa.

(g) Deposition of the plasma layer:

The gas(es) used to obtain the plasma layer was (were) introduced. This introduction could be carried out before the plasma was switched on, after the delay for the total pressure to stabilize, or else could be performed at the end of the pretreatment stage, the plasma in this case remaining in operation. The deposition of the plasma layer was carried out to attain a final thickness of approximately 4.0 to 5.0 µm.

Depending on the deposition conditions (monomer pressure, RF power density), the rates of deposition may vary and result in shorter or longer deposition time periods (see examples). In the case of the deposits corresponding to relatively short time periods (at least one hour in Examples 4, 5, 6, 7 and 8), the cooling of the anode was initiated approximately 2 to 3 minutes after the beginning of this deposition stage.

At the end of the deposition, the electrical current and the gas deliveries were turned off. The pressures relating to the different gases introduced during the deposition stage were measured as follows: the pressure was measured before the pretreatment and deposition stages for each of the gases, these circulating alone in the reactor.

In the examples below the deposited plasma layers were intended to improve the abrasion resistance of the plastic substrate, in this case polymethyl methacrylate. To evaluate this property, the results are expressed by means of behavior in the Taber abrasion test. The adhesiveness of the plasma layer to the substrate is described using this test.

III. TABER ABRASION RESISTANCE TEST AND HAZE MEASUREMENT:

The Taber test was employed to characterize the abrasion resistance properties of the coatings. It is standardized (standards ASTM D-1044 or DIN 52347E or ISO 3537).

Two abrasive wheels (abrasive reference CS-10F) loaded with two weights, each of 500 g, rest on the sample, which was placed on a stage or platform. The stage was rotated (55 rev/min) during the test. The grinding wheels rotated about themselves by virtue of friction with the sample. The greater the number of revolutions the greater will be the wear due to abrasion.

The determination of the abrasion was carried out by an optical method employing a laser beam. Using this method, the quantity of light of the laser beam which was transmitted through the sample to be analyzed was measured.

The characteristic quantity is the percentage of haze. This represents the relative difference between the quantity of light transmitted by the abraded portion of the sample (Ta) in relation to its unabraded portion (To), namely, the percentage of light scattered by the abraded surface of the sample:

$$\% \text{ haze} = \frac{To - Ta}{To} \times 100$$

The values of percentage of haze which are reported in the examples represent average values over 200 points of measurement of intensity of transmitted light. These points were taken on the abraded part of the sample to be analyzed, the latter being rotated in front of the laser beam. Such a number of points can be recorded by virtue of a data acquisition system (one measurement every 200 milliseconds).

The higher the % haze value, the lower was the scratch resistance of the sample, and vice versa.

In the case of plasma layer/substrate unit, the abrasion resistance capacity given by the Taber test is determined by:

(i) the intrinsic hardness of the plasma layer, (ii) the adhesiveness between the plasma layer and the substrate.

A poor adhesiveness induced under the effect of the stresses transmitted by the abrasive wheels to the sample to be analyzed, produced separations of the protective plasma layer. Over the areas where the substrate was no longer protected, the abrasion increases rapidly at each revolution in the Taber test. Consequently, the average % haze value calculated over the entirety of the mark produced by the grinding wheels increased and reflected the existence of this loss in adhesiveness.

Furthermore, it was confirmed that, on a substrate in the case of which the adhesiveness between the plasma layer and the substrate was satisfactory (for example polycarbonate), the plasma layer deposited under deposition conditions indicated in the examples exhibited a clearly sufficient intrinsic hardness. The results obtained in the Taber test on polymethyl methacrylate were therefore directly related to the quality of the adhesiveness between plasma layer and substrate.

EXAMPLE 1 (Control):

This test was carried out in the reactor described above; a cast polymethyl methacrylate (PMMA) substrate, namely, a sheet prepared via polymerization of the MMA monomer between two glass plates, was placed onto the grounded electrode (anode).

Conditions of pretreatment according to U.S. Pat. No. 4,830,873:

Only the monomer (HMDS) was introduced and deposition of a prelayer was commenced, beginning with this monomer, for 60 seconds:

(a) pHMDS: 3.3 Pa (b) Pretreatment time period: 60 seconds (c) RF power density: 41 mW/cm$^3$ Deposition conditions:

Beginning at 30 seconds, progressive introduction of oxygen ($O_2$) and helium (He) was commenced, these gases contributing to providing the hardness of the layer.

(i) pHe: 24.7 Pa—p$O_2$: 6.7 Pa—pHMDS: 3.3 Pa (ii) Deposition time period: 180 min (iii) RF power density: 41 mW/cm$^3$ The thickness of the corresponding plasma layer was 4.1 µm.

Separation of the plasma layer thus deposited from its PMMA substrate was observed on removal of the composite from the reactor.

Pretreatment periods of 5 and 10 min were utilized.

This lack of adhesiveness to PMMA still remained after deposition of the plasma film.

EXAMPLE 2:

This test was carried out in the same reactor as utilized in Example 1. A cast PMMA substrate was placed onto the grounded electrode (anode).

Pretreatment conditions:

(a) p$O_2$: 6.5 Pa (b) Pretreatment time period: 30 seconds (c) RF power density: 165 mW/cm$^3$ Deposition conditions:

These were the same as those indicated in Example 1. The thickness of the corresponding plasma layer was 4.0 µm.

Figure 1:
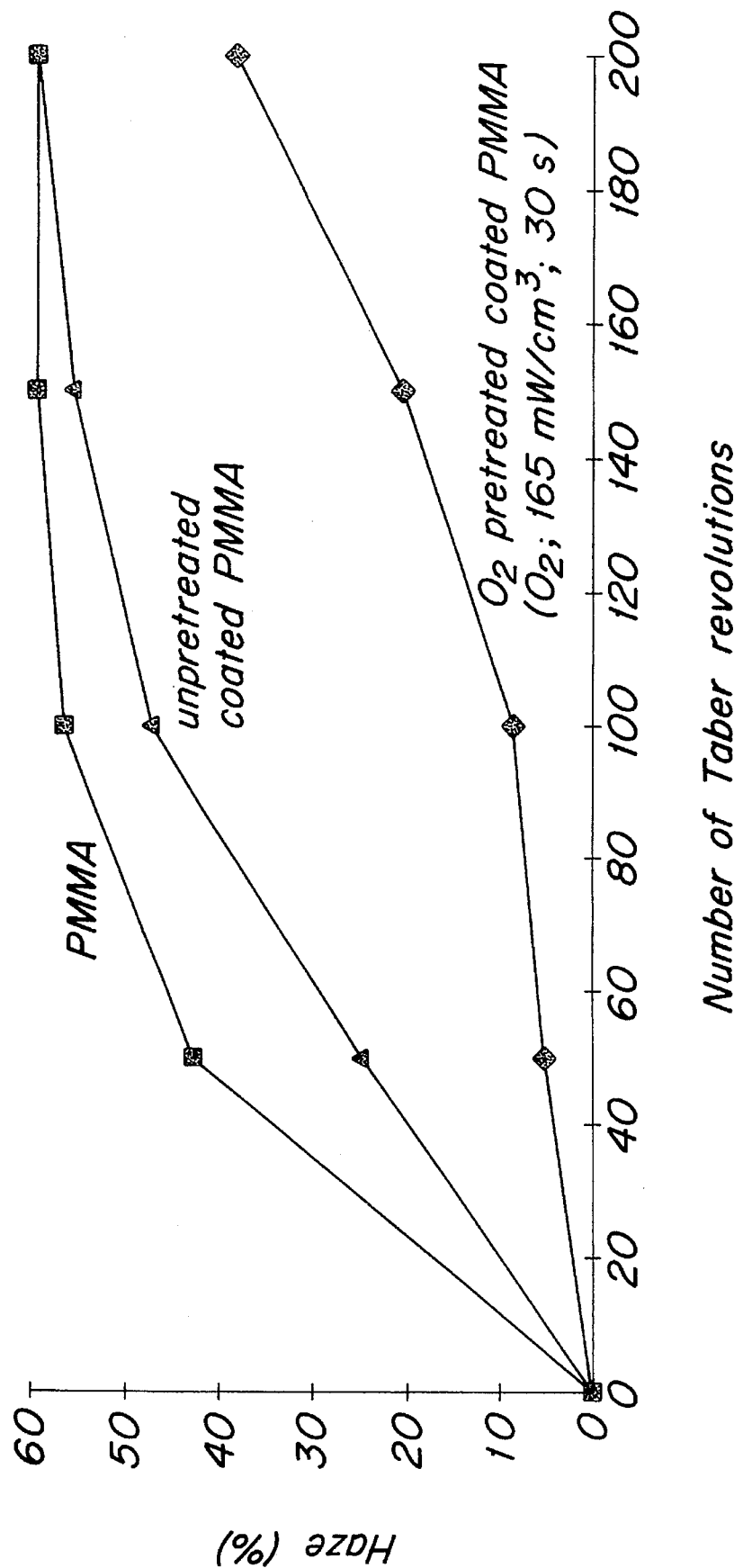
FIG. 1 is a graph illustrating the results of Taber tests performed on plasma layers deposited onto PMMA, one being deposited onto PMMA pretreated with an $O_2$ plasma in accordance with the process according to the invention, the other being deposited onto unpretreated PMMA (Example 2).

The results in the Taber test are illustrated in FIG. 1 which also plots, by way of comparison, the results in the Taber test for PMMA coated with plasma deposit without pretreatment (under the same conditions as those of Example 1) and for unpretreated uncoated PMMA.

When compared with a plasma deposit without pretreatment, an improvement was found in the abrasion resistance when the PMMA was pretreated in an oxygen plasma under the conditions according to the invention.

These results, obtained by reason of the improvement in adhesiveness between the plasma layer and the substrate, evidenced that the presence of oxygen in the pretreatment stage was beneficial, provided that the most appropriate pretreatment conditions were selected (high power density, short pretreatment period), according to the present invention.

EXAMPLE 3 (Control):

This test was carried out in the same reactor as utilized in Example 1. A cast PMMA substrate was placed onto the highly polarized exciting electrode (cathode) during the pretreatment stage and then on the grounded electrode (anode) during the deposition stage.

Pretreatment conditions:

(a) p$O_2$: 5.7 Pa (b) Pretreatment time period: 30 seconds (c) RF power density: 165 mW/cm$^3$ (d) Cathode self-polarization potential: 530 volts Deposition conditions:

These were the same as those reported in Example 1. The thickness of the corresponding plasma layer was 4.1 μm.

Figure 2:
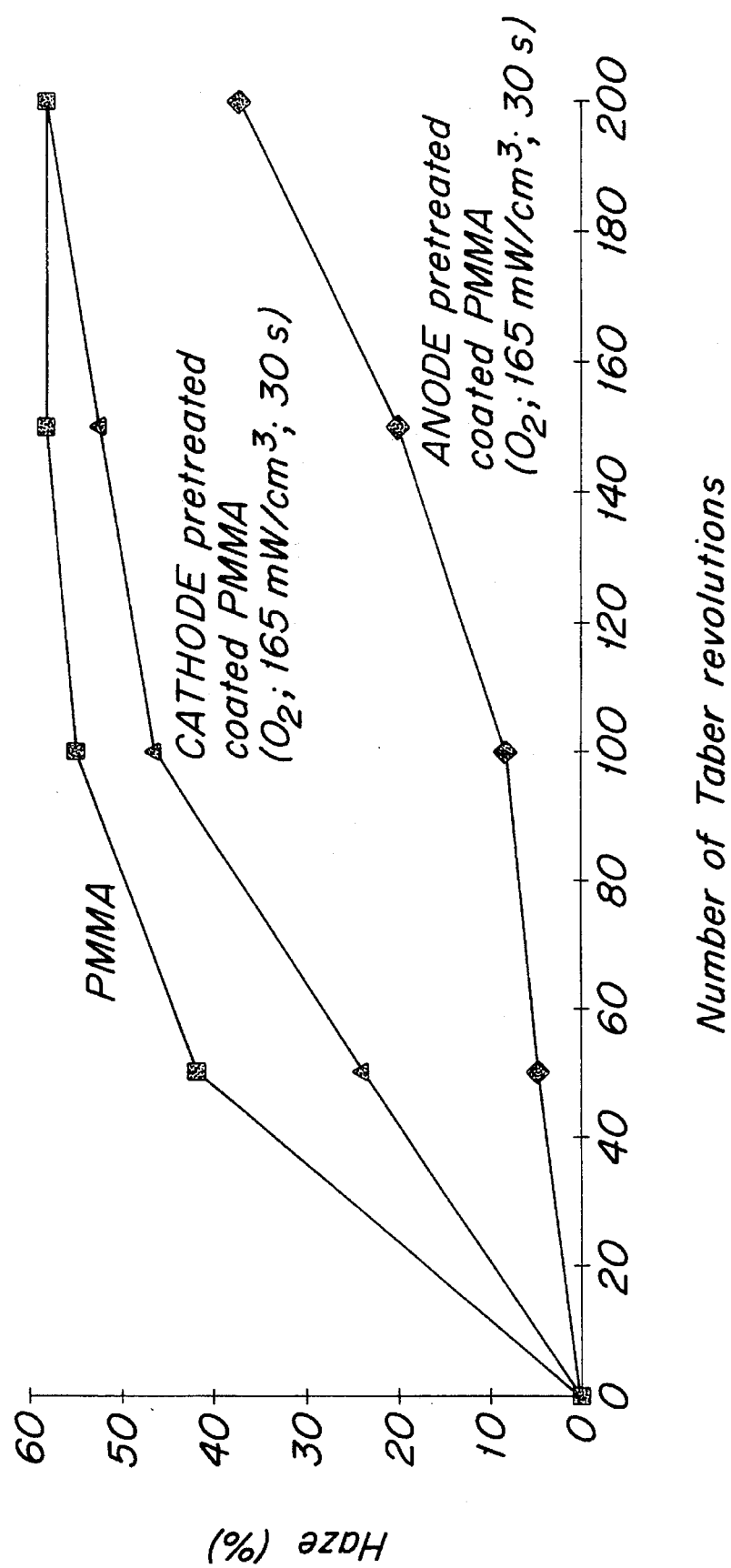
FIG. 2 is a graph illustrating the results of Taber tests performed on plasma layers deposited onto PMMA, one being deposited on PMMA pretreated at the anode with an $O_2$ plasma in accordance with the process according to the invention, the other being deposited onto PMMA pretreated at the cathode (not in accordance with the invention) with an $O_2$ plasma under identical conditions (Example 3).

The results in the Taber test are illustrated in FIG. 2 which also plots, by way of comparison, the results in the Taber test for PMMA coated with plasma deposit without pretreatment performed at the anode (zero polarization potential and pretreatment and deposition conditions of Example 2) and for unpretreated and uncoated PMMA.

It was determined that the advantageous effect of the pretreatment under the conditions in accordance with the invention was reduced to zero when the substrate was arranged at the cathode, i.e., no adhesiveness existed between the plasma layer and the substrate.

These results therefore evidenced the importance of the polarization of the substrate/carrier during the stage of pretreatment of the PMMA substrate (not described in EP-A-0,254,205).

EXAMPLE 4:

This test was carried out in the same reactor as utilized in Example 1. A cast PMMA substrate was placed onto the grounded electrode (anode).

Pretreatment conditions:

(a) pO$_2$: 6.7 Pa (b) Pretreatment time period: 60 seconds (c) RF power density: 41 mW/cm$^3$ Deposition conditions:

(i) pHMDS: 7.2 Pa pO$_2$: 4.8 Pa (ii) Deposition time period: 59 min (iii) RF power density: 206 mW/cm$^3$ The thickness of the corresponding plasma layer was 5.5 μm.

Figure 3:
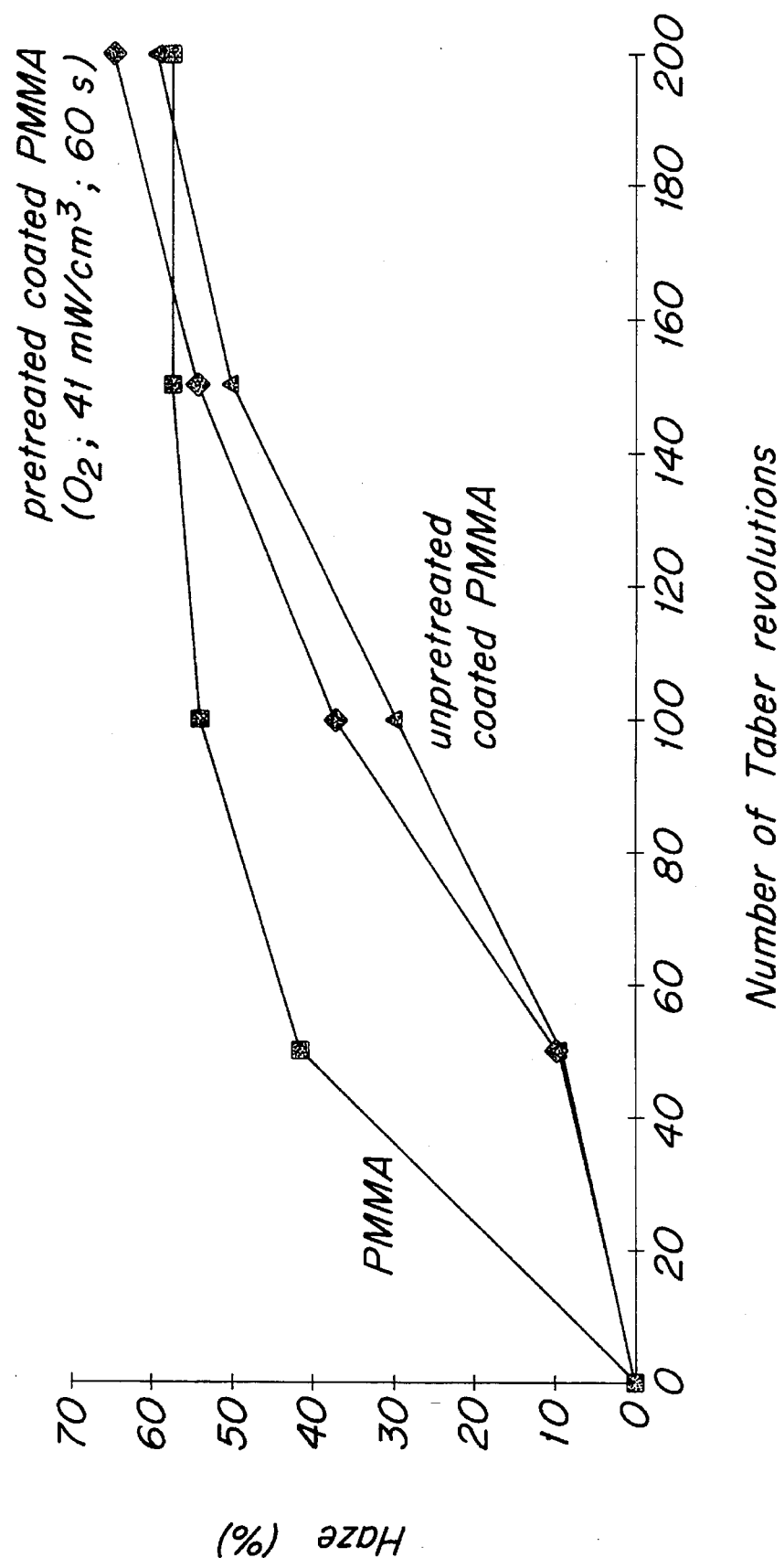
FIG. 3 is a graph illustrating the results of Taber tests performed on plasma layers deposited onto PMMA, one being deposited onto PMMA pretreated under the conditions not in accordance with the process according to the invention, in terms of power density and of pretreatment time period, the other being deposited onto unpretreated PMMA (Example 4).

The results in the Taber test are illustrated in FIG. 3 which also plots, by way of comparison, the results in the Taber test for unpretreated plasma-coated PMMA (under the same deposition conditions as those of Example 4) and for unpretreated and not plasma-coated PMMA.

These results evidenced that, if pretreatment conditions corresponding to a low power density (41 mW/cm$^3$) and a relatively lengthy time period (60 seconds) were employed, no improvement in the abrasion resistance was realized when compared with the PMMA substrate coated with the same plasma film and unpretreated; this was due to poor adhesiveness between the plasma layer and the substrate.

Only the conditions of pretreatment according to the invention (high power density delivered for a short time period) provided an improvement in adhesiveness and, consequently, a significant improvement in abrasion resistance.

EXAMPLE 5:

This test was carried out in the same reactor as utilized in Example 1. A cast PMMA substrate was placed onto the grounded electrode (anode).

Pretreatment conditions:

(a) pO$_2$: 4.8 Pa (b) Pretreatment time period: 3 seconds (c) RF power density: 206 mW/cm$^3$ Reposition conditions:

These were the same as those indicated in Example 4, except for the deposition period of time which was equal to 50 min. The thickness of the corresponding plasma film was 4.7 μm in this instance.

Figure 4:
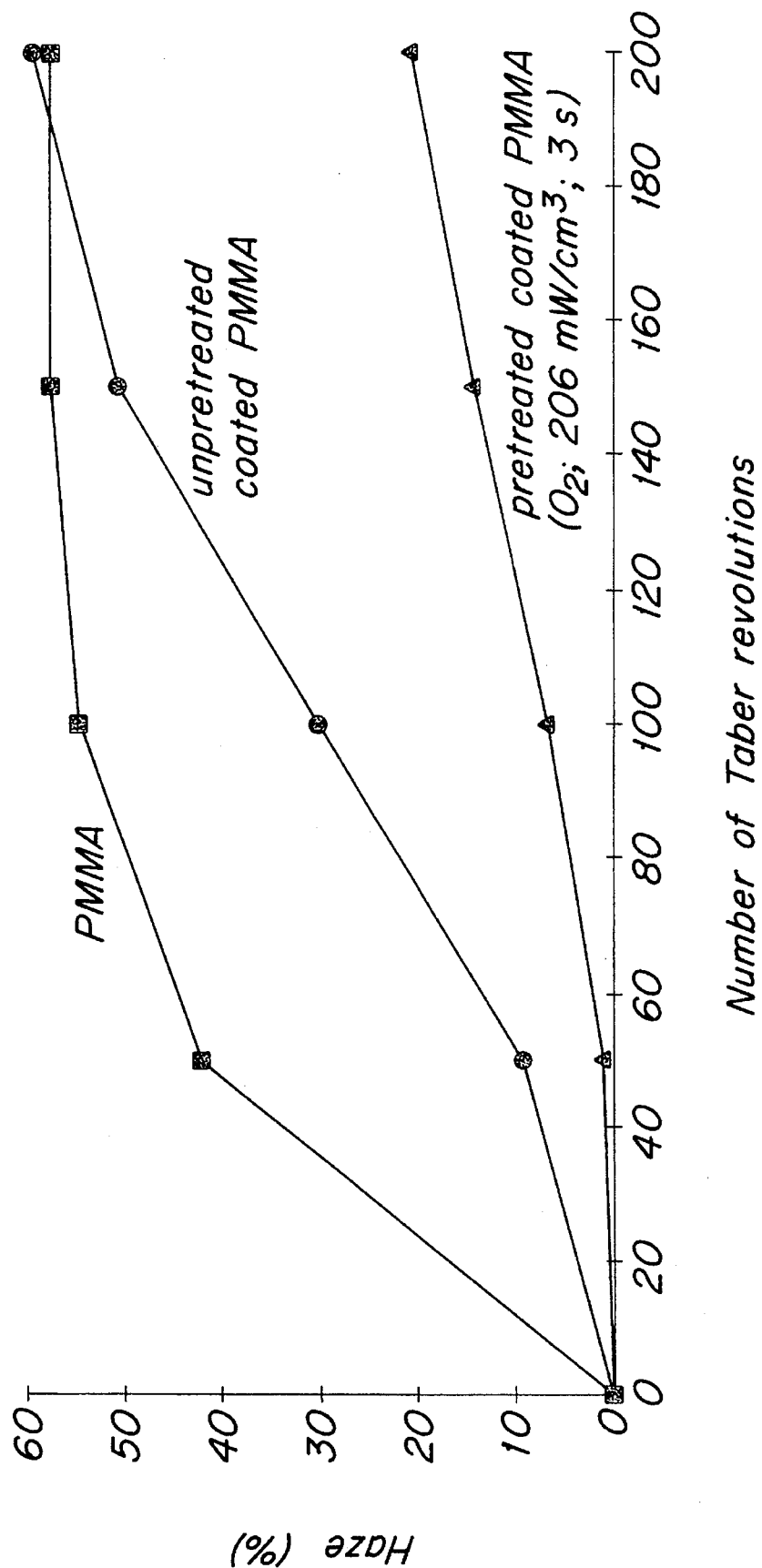
FIG. 4 is a graph illustrating the results of Taber tests performed on plasma layers deposited onto PMMA, one being deposited onto PMMA pretreated with an $O_2$ plasma in accordance with the process according to the invention, under different conditions of pretreatment of Example 2, the other being deposited onto unpretreated PMMA (Example 5).

The results in the Taber test are illustrated in FIG. 4 which also plots, by way of comparison, the results in the Taber test for unpretreated plasma-coated PMMA (under the same deposition conditions as those of Example 4) and for unpretreated and not plasma-coated PMMA.

These results evidenced the importance of the conditions of pretreatment according to the invention (high power density delivered for a short time period) for the adhesiveness between the plasma layer and substrate and, consequently, for the abrasion resistance of this composite.

EXAMPLE 6 (Control):

This test was carried out in the same reactor as utilized in Example 1. A cast PMMA substrate was placed onto the grounded electrode (anode). In this example the pretreatment gas employed was water vapor.

Pretreatment conditions:

(a) pH$_2$O: 6.3 Pa (b) Pretreatment time period: 300 seconds (c) RF power density: 49.5 mW/cm$^3$ Deposition conditions:

The monomer (HMDS) was introduced into the water vapor plasma. The RF power density was increased and set at 206 mW/cm$^3$. The water vapor was then replaced with oxygen. These operations were carried out over a short period of time (a few tens of seconds). The deposition was then conducted principally under the conditions described in Example 4, except that the total deposition time period was 50 min.

Measurement of the thickness of the plasma film could not be performed because of the separation of said film from its PMMA substrate.

This example evidenced that conditions of pretreatment corresponding to a low power density delivered for a long period of time do not provide adequate adhesiveness between the plasma film and the PMMA, even when employing a pretreatment gas other than molecular oxygen.

EXAMPLE 7:

This test was carried out in the same reactor as utilized in Example 1. A cast PMMA substrate was placed onto the grounded electrode (anode). In this example the pretreatment gas employed was water vapor. The pretreatment conditions were those according to the invention.

Pretreatment conditions:

(a) pH$_2$O: 5.2 Pa (b) Pretreatment time period: 30 seconds (c) RF power density: 165 mW/cm$^3$ Deposition conditions:

The monomer (HMDS) was introduced into the water vapor plasma. The RF power density changed to 206 mW/cm$^3$. The water vapor was then replaced with oxygen. These operations were conducted over a very short period of time (a few tens of seconds). The deposition was then conducted principally under the conditions described in Example 4, except that the total deposition time period was 60 min.

The thickness of the corresponding plasma film was 5.0 μm in this instance.

Figure 5:
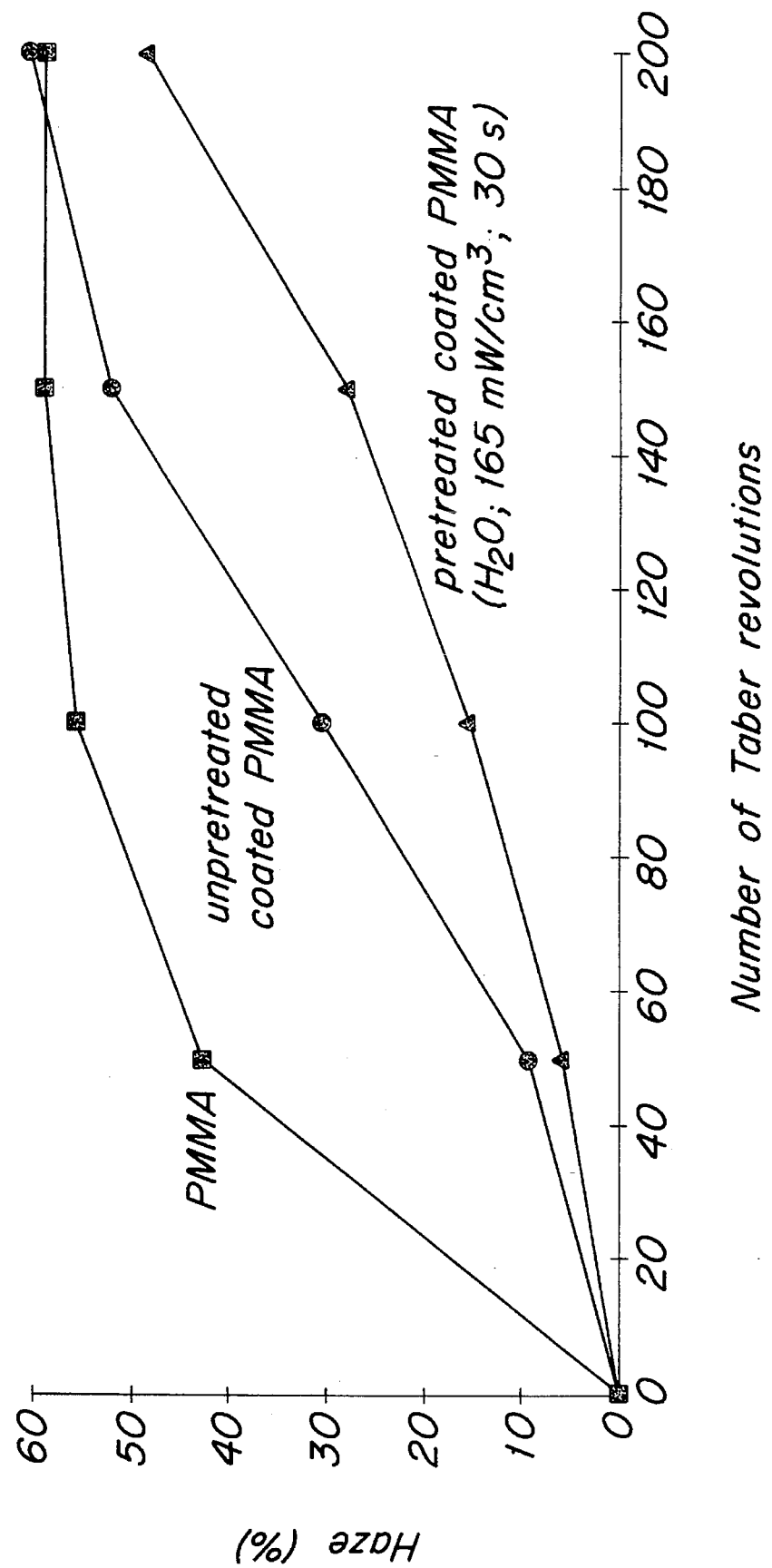
FIG. 5 is a graph illustrating the results of Taber tests performed on plasma layers deposited onto PMMA, one being deposited onto PMMA pretreated with a water vapor plasma in accordance with the process according to the invention, the other being deposited onto unpretreated PMMA (Example 7).

The results in the Taber test are illustrated in FIG. 5 which also plots, by way of comparison, the results in the Taber test for unpretreatment plasma-coated PMMA (under the same deposition conditions as those of Example 4) and for unpretreated and not plasma-coated PMMA.

These results evidenced the importance of the conditions of pretreatment according to the invention (high power density delivered for a short period) to provide a good adhesiveness of the deposit to the PMMA substrate.

EXAMPLE 8:

This test was carried out in the same reactor as that utilized in Example 1. The substrate was a sheet prepared by injection molding a glutarimide/methyl methacrylate copolymer marketed under the trademark Kamax by Rohm & Haas. This substrate was placed onto the grounded electrode (anode).

Pretreatment conditions:

(a) $pO_2$: 10.9 Pa (b) Pretreatment time period: 30 seconds (c) RF power density: 165 mW/cm$^3$ Deposition conditions:

(i) pHMDS: 8.0 Pa $pO_2$: 10.9 Pa (ii) Deposition time period: 82 min (iii) RF power density: 206 mW/cm$^3$ The thickness of the corresponding plasma layer was 5.2 μm.

Figure 6:
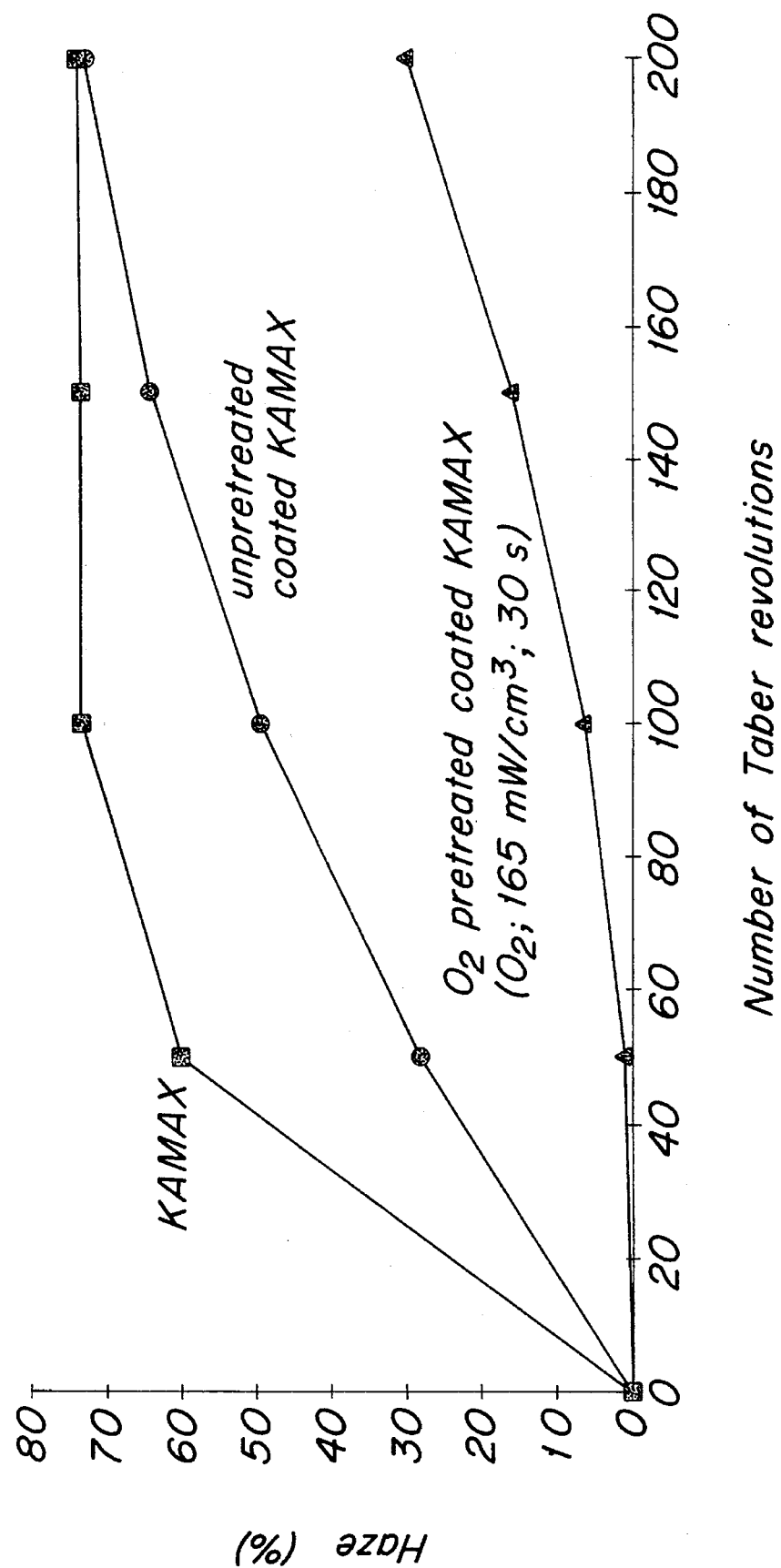
FIG. 6 is a graph illustrating the results of Taber tests performed on plasma layers deposited onto glutarimide/ methyl methacrylate copolymers of trademark Kamax (Rohm & Haas), one being deposited onto Kamax pretreated with an $O_2$ plasma in accordance with the process according to the invention, the other being deposited onto unpretreated Kamax.

The results in the Taber test are illustrated in FIG. 6 which also plots, by way of comparison, the results in the Taber test for unpretreated, plasma-coated Kamax (under the same deposition conditions as those indicated above) and for unpretreated and not plasma-coated Kamax. These results evidenced the influence of the pretreatment carried out under pretreatment conditions according to the invention, on the adhesiveness between the plasma film and the substrate.

While the invention has been described in terms of various preferred embodiments, the skilled artisan will appreciate that various modifications, substitutions, omissions, and changes may be made without departing from the spirit thereof. Accordingly, it is intended that the scope of the present invention be limited solely by the scope of the following claims, including equivalents thereof.

What is claimed is:

1. A process for the deposition of a thin protective layer or film onto a face surface of a plastic substrate, which comprises (a) placing said plastic substrate on a weakly or unpolarized electrode comprising a plasma-generating circuit, (b) plasma-pretreating said plastic substrate in an oxygen plasma, under primary vacuum, by a pulse of electrical power density of such minimum magnitude as to oxygen-activate a face surface thereof, and (c) plasma-polymerizing at least one organosilicon monomer onto the face surface of said plastic substrate, also under vacuum and from an oxygen/organosilicon monomer plasma, whereby depositing said thin protective layer or film thereon.

2. The process as defined by claim 1, said weakly or unpolarized electrode comprising the anode of said plasma-generating circuit.

3. The process as defined by claim 1, said electrical power density being at least 50 mW/cm$^3$.

4. The process as defined by claim 3, said electrical power density ranging from 80 mW/cm$^3$ to 500 mW/cm$^3$.

5. The process as defined by claim 4, said electrical power density being about 165 mW/cm$^3$.

6. The process as defined by claim 3, said electrical power density being of pulse duration of from about 1 second to about 100 seconds.

7. The process as defined by claim 6, said electrical power density being of pulse duration of from about 3 seconds to about 50 seconds.

8. The process as defined by claim 7, said electrical power density being of pulse duration on the order of about 30 seconds.

9. The process as defined by claim 1, said pretreatment oxygen plasma comprising oxygen, nitrous oxide, carbon monoxide or dioxide, water vapor, air, a rare gas, nitrogen, hydrogen or mixture thereof.

10. The process as defined by claim 1, said pretreatment oxygen plasma comprising at least one organosilicon compound.

11. The process as defined by claim 10, said at least one organosilicon compound comprising a silane, alkoxysilane, siloxane, silazane, or mixture thereof.

12. The process as defined by claim 11, said at least one organosilicon compound comprising hexamethyldisiloxane.

13. The process as defined by claim 1, said oxygen/organosilicon monomer plasma of polymerization comprising oxygen, nitrous oxide, carbon monoxide or dioxide, water vapor, air, a rare gas, nitrogen, hydrogen or mixture thereof.

14. The process as defined by claim 13, said oxygen/organosilicon monomer plasma of polymerization comprising a silane, alkoxysilane, siloxane, silazane, or mixture thereof.

15. The process as defined by claim 14, said oxygen/organosilicon monomer plasma of polymerization comprising hexamethyldisiloxane.

16. The process as defined by claim 1, said pretreatment oxygen plasma being the same as said oxygen/organosilicon monomer plasma of polymerization.

17. The process as defined by claim 1, wherein the plasma-generating frequency ranges from 0 Hz to a few GHz.

18. The process as defined by claim 1, said plastic substrate comprising a filled or unfilled polyolefin, polyacrylic, polycarbonate, or vinyl aromatic polymer.

19. The process as defined by claim 18, said plastic substrate comprising a polypropylene, polystyrene, or methyl methacrylate polymer.

20. The process as defined by claim 19, said plastic substrate comprising the copolymerizate of methyl methacrylate with a comonomer selected from among (meth)acrylic acid, hydroxyalkyl (meth)acrylate, alkoxyalkyl (meth)acrylate, (meth)acrylonitrile, (meth)acrylamide, maleimide, maleic anhydride, substituted or unsubstituted styrene, or a diene.

21. The process as defined by claim 18, such filled or unfilled polymer comprising glutarimide functional groups.

\* \* \* \* \*